(12) United States Patent
Aoto et al.

(10) Patent No.: US 7,545,638 B2
(45) Date of Patent: Jun. 9, 2009

(54) CARD SLOT AND ELECTRONIC DEVICE PROVIDED WITH CARD SLOT

(75) Inventors: Hiroaki Aoto, Yokohama (JP); Naoki Hiyama, Yokohama (JP)

(73) Assignee: Otax Co., Ltd., Yokohama-shi (JP)

( * ) Notice: Subject to any disclaimer, the term of this patent is extended or adjusted under 35 U.S.C. 154(b) by 38 days.

(21) Appl. No.: 11/955,756

(22) Filed: Dec. 13, 2007

(65) Prior Publication Data
US 2008/0212277 A1    Sep. 4, 2008

(30) Foreign Application Priority Data
Dec. 15, 2006    (JP) .............................. 2006 3 38010

(51) Int. Cl.
*H05K 7/20* (2006.01)
*G06F 1/18* (2006.01)

(52) U.S. Cl. ...................... 361/687; 361/710; 361/715; 361/719; 439/159; 439/485; 439/487

(58) Field of Classification Search ................. 361/687, 361/70–712, 715, 719, 720, 727, 752, 784; 439/159, 160, 325, 485, 487; 174/15.1, 16.3, 174/252
See application file for complete search history.

(56) References Cited

U.S. PATENT DOCUMENTS 6,278,609 B1 *   8/2001   Suzuki et al. ............... 361/704

(Continued)

FOREIGN PATENT DOCUMENTS

JP    10198462 A    7/1998

(Continued)

*Primary Examiner*—Michael V Datskovskiy
(74) *Attorney, Agent, or Firm*—Christensen O'Connor Johnson Kindness PLLC (57) ABSTRACT

A card slot according to the present invention is provided with a slot body, a heat sink, a first support and a second support. The slot body is configured to internally store an IC card. The heat sink is provided with a heat sink body and a first spring. The first spring is attached to the substantial center of an upper surface of the heat sink body, and supports the heat sink body. Also, the first spring is lowered with insertion of the IC card inside the slot, and presses the heat sink body downward. The first support is provided with two first leg sections, a first linking section and a first pressing spring. The two first leg sections are arranged facing positions sandwiching the heat sink body close to one end side of the slot body. The first linking section links fellow upper end vicinities of the two first leg sections. The first pressing spring extends from either the first leg sections or the first linking section towards an upper surface of the heat sink body, to press the upper surface of the heat sink body downwards. The second support is provided with two second leg sections, a second linking section and a second pressing spring. The two second leg sections are arranged facing positions sandwiching the heat sink body close to another end side of the slot body. The second linking section links fellow upper end vicinities of the two second leg sections. The second pressing spring extends from either the second leg sections or the second linking section towards an upper surface of the heat sink body, to press the upper surface of the heat sink body downwards.

7 Claims, 10 Drawing Sheets

U.S. PATENT DOCUMENTS

| | | | |
|---|---|---|---|
| 6,942,506 B2 * | 9/2005 | Kimura et al. | 439/159 |
| 7,090,519 B2 * | 8/2006 | Muramatsu et al. | 439/159 |
| 7,133,285 B2 * | 11/2006 | Nishimura | 361/715 |
| 2006/0258203 A1 * | 11/2006 | Watanabe et al. | 439/485 |

FOREIGN PATENT DOCUMENTS

| | | | |
|---|---|---|---|
| JP | 2005222537 A | | 8/2005 |
| JP | 20052422946 A | * | 9/2005 |
| JP | 2005285522 A | | 10/2005 |

* cited by examiner

CARD SLOT AND ELECTRONIC DEVICE PROVIDED WITH CARD SLOT

BACKGROUND

1. Field of the Invention

The present invention relates to a card slot, and to an electronic device provided with such a card slot.

2. Description of the Related Art

A card slot for attaching an IC card (for example a PCM-CIA card) to an electronic device (for example, a lap top computer or a flat-screen television) has conventionally been used. By inserting the IC card into the card slot, it is possible to connect the IC card and the electronic device.

However, recent IC cards have become highly functional (for example, having a wireless function etc.) and contain highly integrated circuitry, which means that a lot of heat is generated internally. A need has therefore arisen to radiate internally generated heat to the outside.

As technology for radiating internally generated heat of an IC card, for example, there is the technology disclosed in FIG. 2 of Unexamined Japanese patent application Hei. 10-198462 (patent document 1). With this technology, a radiator is previously arranged inside the slot. If an IC card is inserted into the inside of the slot, the radiator and the IC card are brought into contact, and heat of the IC card is radiated via the radiator.

However, with this technology, at the time of inserting the IC card there is friction between the radiator and the IC card, which means that there is the drawback that force is required to insert the IC card.

On the other hand, with technology disclosed in unexamined Japanese patent application No. 2005-222537 (patent document 2), before inserting the IC card a heatsink is retracted upwards. If the IC card is inserted, the heatsink is gradually lowered by a cam mechanism. The heatsink and the IC card are brought into contact with each other along the insertion stroke of the IC card. With this technology, at the start of insertion of the IC card, there is no resistance by the heatsink to insertion, and so insertion is smooth.

However, with this technology also, at some point during insertion of the IC card there is friction between the lower surface of the heatsink and the upper surface of the IC card, which means that insertion resistance suddenly increases once that point in time is reached. If this happens, it is conceivable that, depending on the user, they may be under the misconception that the card has been sufficiently inserted before the IC card is connected to the electronic device, and stop insertion.

The technology disclosed in unexamined Japanese patent application 2005-285522 (patent document 3), similar to the disclosure of patent document 2, also lowers a heatsink using a cam mechanism. However, with this technology, a structure to automatically lower the heat sink after the IC card has been completely inserted into the slot is adopted. By doing this, during insertion of the IC card the heat sink and the IC card do not interfere with each other, and so insertion resistance is slight. With this technology, however, a mechanism is required to independently lower the heat sink after insertion of the IC card, and there is the drawback that the structure will be made complicated and the number of components increased. These are both likely to be the cause of failure and increased cost.

Patent Publication 1:
  Unexamined Japanese patent application No. Hei. 10-198462

Patent Publication 2:
  Unexamined Japanese patent application No. 2005-222537

Patent Publication 3:
  Unexamined Japanese patent application No. 2005-285522

The present inventors are proposing a card slot in which an IC card can be easily and reliably fitted. This technology has a general structure as outlined in the following.

Cam surface moves with insertion of IC card.
  Pin lowered in line with the shape of this cam surface, and plate spring attached to pin lowered.
  With lowering of the plate spring, heatsink supported by plate spring lowered.

Once above sequence of operations is completed, the lower surface of the heatsink contacts the IC card. In this way it becomes possible to radiate heat using the heatsink.

Here, the plate spring supporting the heat sink is attached by a screw to the center of the upper surface of the heat sink, at the center part of the plate spring.

In a state where this type of card slot is assembled on a substrate, there may be cases when the substrate is conveyed. For example, at a factory or the like where a heatsink with card slot attached is assembled, the place where the card slot is attached to the substrate and the place where the substrate is attached to a casing may be some distance apart. In this situation it is necessary to convey the substrate.

Here, if the substrate is dropped during conveyance, or it bumps into something, impact will be applied to the substrate. At this time, with the technology described, since the heatsink is supported by a plate spring, there is a possibility that the position of the heatsink will deviate from a predetermined position. If this type of positional deviation arises, there will be disadvantages such as it becoming difficult to incorporate the substrate into the casing.

In order to avoid this type of problem, means such as raising the strength of the spring supporting the heat sink and installing a guide member are conceivable. However, in this case it is likely that other disadvantages will arise, such as the card slot being increased in size and the weight increasing. In particular, in order to increase the thermal capacity of the heatsink and increase its contact surface area with the outside air, the heatsink often has a particular size and weight. It is therefore easy for the above-described disadvantages to arise.

The present invention has been conceived in view of the above-described situation. An object of the present invention is to provide a card slot that can improve shock resistance, and an electronic device that uses such a card slot.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

A card slot according to the present invention is provided with a slot body, a heat sink, a first support and a second support. The slot body is configured to internally store an IC card. The heat sink is provided with a heat sink body and a first spring. The first spring is attached to the substantial center of an upper surface of the heat sink body, and supports the heat sink body. Also, the first spring is lowered with insertion of the IC card inside the slot, and presses the heat sink body downward. The first support is provided with two first leg sections, a first linking section and a first pressing spring. The two first leg sections are arranged facing positions sandwiching the heat sink body close to one end side of the slot body. The first linking section links fellow upper end vicinities of the two first leg sections. The first pressing spring extends from either the first leg sections or the first linking section towards an upper surface of the heat sink body, to press the upper surface of the heat sink body downwards. The second support is provided with two second leg sections, a second linking section and a second pressing spring. The two second leg sections are arranged facing positions sandwiching the heat sink body close to another end side of the slot body. The second linking section links fellow upper end vicinities of the two second leg sections. The second pressing spring extends from either the second leg sections or the second linking section towards an upper surface of the heat sink body, to press the upper surface of the heat sink body downwards.

According to this invention, it is possible to press the upper surface of the heatsink body downwards using the first pressing spring and the second pressing spring. On the other hand, it is possible to support the substantial center of the upper surface of the heatsink body in a hoisted up state using the first spring. As a result, the heatsink body is held at a position where the downward pressing force of the first and second pressing springs and the upward pulling force of the first spring balance each other.

The upper surface shape of the heat sink body is, for example, substantially square. There may be two of each of the first pressing spring and the second pressing spring. Naturally, it is also possible to have three or more of each. Also, the first pressing spring and the second pressing spring can make contact close to the four corners of the upper surface of the heat sink body. Obviously, it is possible to make contact at portions other than the four corners, but in a state being pressed by these springs, keeping the lower surface of the heat sink body parallel with the upper surface of the IC card is desirable.

The first spring may be constituted as a plate spring. It is possible to have a structure where one end of the first spring can be lowered with insertion of the IC card into the slot body. The other end of the first spring can be attached to the slot body.

The card slot of this invention can be further provided with a card ejection lever. It is possible for the card ejection lever to be provided with a cam surface. The cam surface is moved by insertion force of the IC card when the IC card is inserted into the slot body. It is possible for the heat sink to be further provided with a first guide pin. The first guide pin may be attached to the other end of the first spring. Further, the first guide pin can be configured to be lowered by movement of the cam surface.

It is possible for contact surfaces that extend in the direction of the heat sink body and contact the upper surface of the slot body to be formed on the first leg section of the first support or the second leg section of the second support. If force in the direction of the heat sink acts on the first leg section or the second leg section, it is possible to support these leg sections using the contact surface. In this way, it is possible to improve the strength of these leg sections.

It is possible for the first leg section and the second leg section to be respectively provided with a leg section body and an extension section. It is possible to form the leg section body in a plate shape. It is possible for a lower end section of the leg section body to be inlayed in the slot body. It is also possible for the extension section to be extended from a position above the lower end section in a direction orthogonal to the surface of the leg section body. It is possible for the lower surface of the extension section to be made the previously described contact surface of the present invention.

Also, an electronic device of the present invention is provided with a card slot having any of the previously described configurations.

With the card slot of the present invention and the electronic device provided with the card slot, by providing a first support and a second support it is possible to improve the shock resistance of the card slot.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

In the following, a card slot of one embodiment of the present invention will be described with reference to the attached drawings (Structure of the Device of the Embodiment)

The card slot 1 of this embodiment comprises a slot body 10, a card ejection lever 20, a heat sink 30, a biasing mechanism 40, a first support 50 and a second support 60 (refer to FIG. 1 to FIG. 10).

The slot body 10 comprises a housing 11, guide sections 12 and 13, a card ejection mechanism 14, an upper cover 15 and a slider 16, and is configured to house an IC card 3 (refer to FIG. 2) inside.

The housing 11 is provided with a plurality of pins 111 for connecting to the IC card 3. The housing 11 is arranged so as to contact the lower surface of the upper cover 15, and is attached between the guide sections 12 and 13.

The guide sections 12 and 13 extend along the insertion direction of the IC card 3. Grooves 121 and 131 for guiding the IC card 3 while retaining it are respectively formed in opposed surfaces of the guide sections 12 and 13. In this manner, the slot body 10 is capable of holding the IC card 3 between the guide section 12 and the guide section 13.

The card ejection lever 14 is provided with a plate-shaped link member 141. The link member 141 is attached, at its middle section 141a, to a lower surface center of the upper cover 15 so that rotation is possible in forward and reverse directions.

Figure 1:
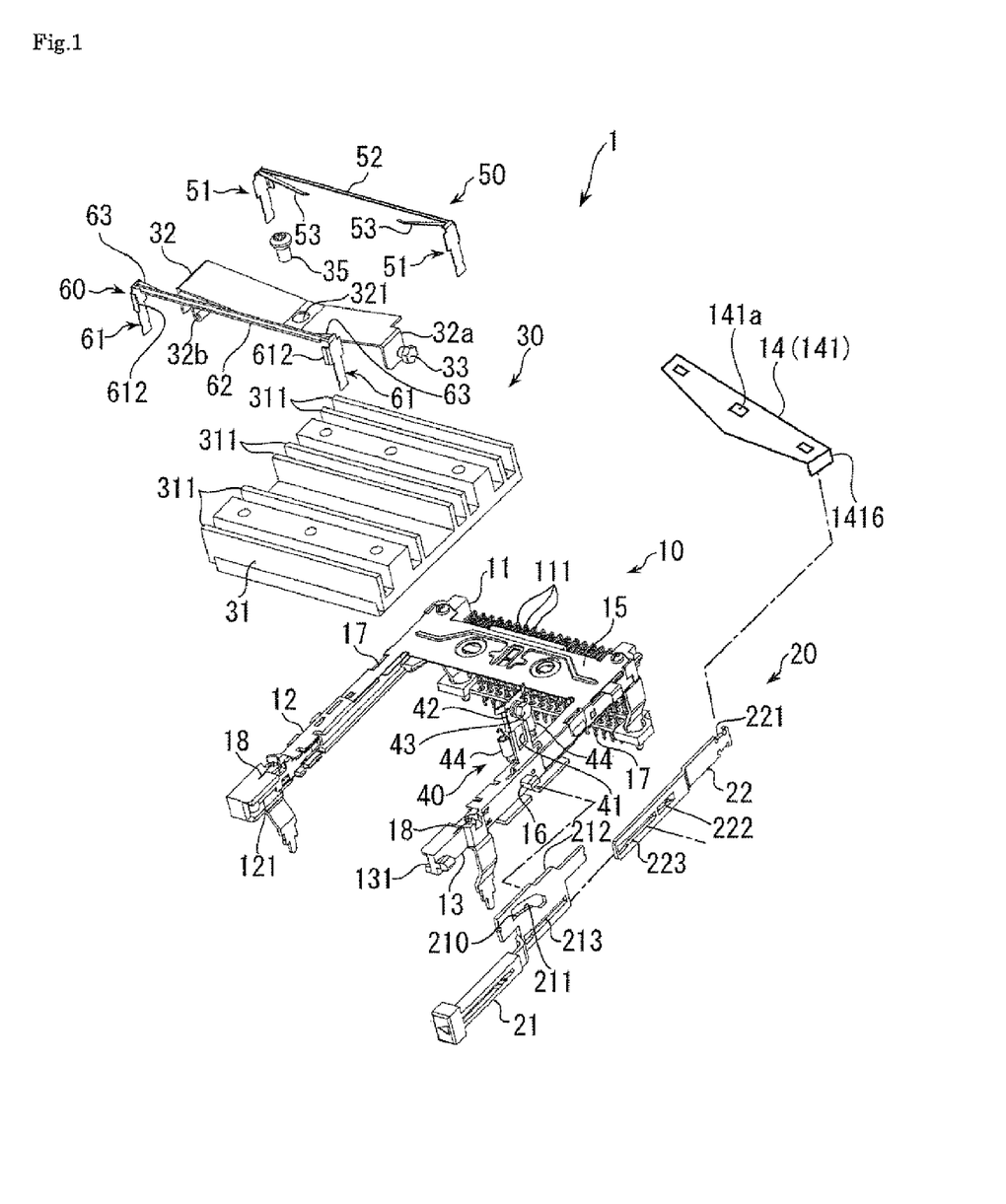
FIG. 1 is an exploded perspective view of main parts of a card slot relating to one embodiment of the present invention.

A hook 141b is formed on one end of the link member 141 (the right end in FIG. 1). The hook 141b is fitted into an indent 221 (described later) formed close to an end section of the card ejection lever 20. The other end of the link member 141 (the left end in FIG. 1) is contacted by a tip end of the IC card 3 and pushed when the IC card 3 has been inserted into the inside of the slot body 10. The hook 141b formed on one end of the link member 141 is then moved by a link operation in a direction opposite to the insertion direction of the IC card 3. In this way, with this embodiment it is possible to cause the card ejection lever 20 to move in a direction opposite to the insertion direction of the IC card 3 by using the pressing force for inserting the IC card 3 into the slot body 10.

The upper cover 15 connects between the guide section 12 and the guide section 13.

The slider 16 is attached to an outer side surface of the guide section 13 (refer to FIG. 1). The slider 16 is fitted into two slits 213 and 223 in the card ejection lever 20. In this way the slider 16 guides the card ejection lever 20 so that it moves along the extension direction of the guide section 13.

The structure of each section of the slot body 10 can be basically the same as the related art, and detailed description other than that is omitted.

The card ejection lever 20 is provided with an inner member 21 and an outer member 22. The inner member 21 is provided with a first cam surface 211 and a second cam surface 212.

The first cam surface 211 is constituted by the inner peripheral surface of a through hole 210 formed in the inner member 21. The first cam surface 211 is provided with a flat section 211a, a gentle slope section 211b, and a steep slope section 211c (corresponding to the first steep slope section) (refer to FIG. 4). The first cam surface 211 guides the first guide pin 33 (described later) that is provided on the heat sink 30 in line with its own shape. The first cam surface 211, as will be described later, is shaped to cause the heat sink 30 to be lowered with movement of the card ejection lever 20, and come into contact with the upper surface of the IC card 3.

Figure 4:
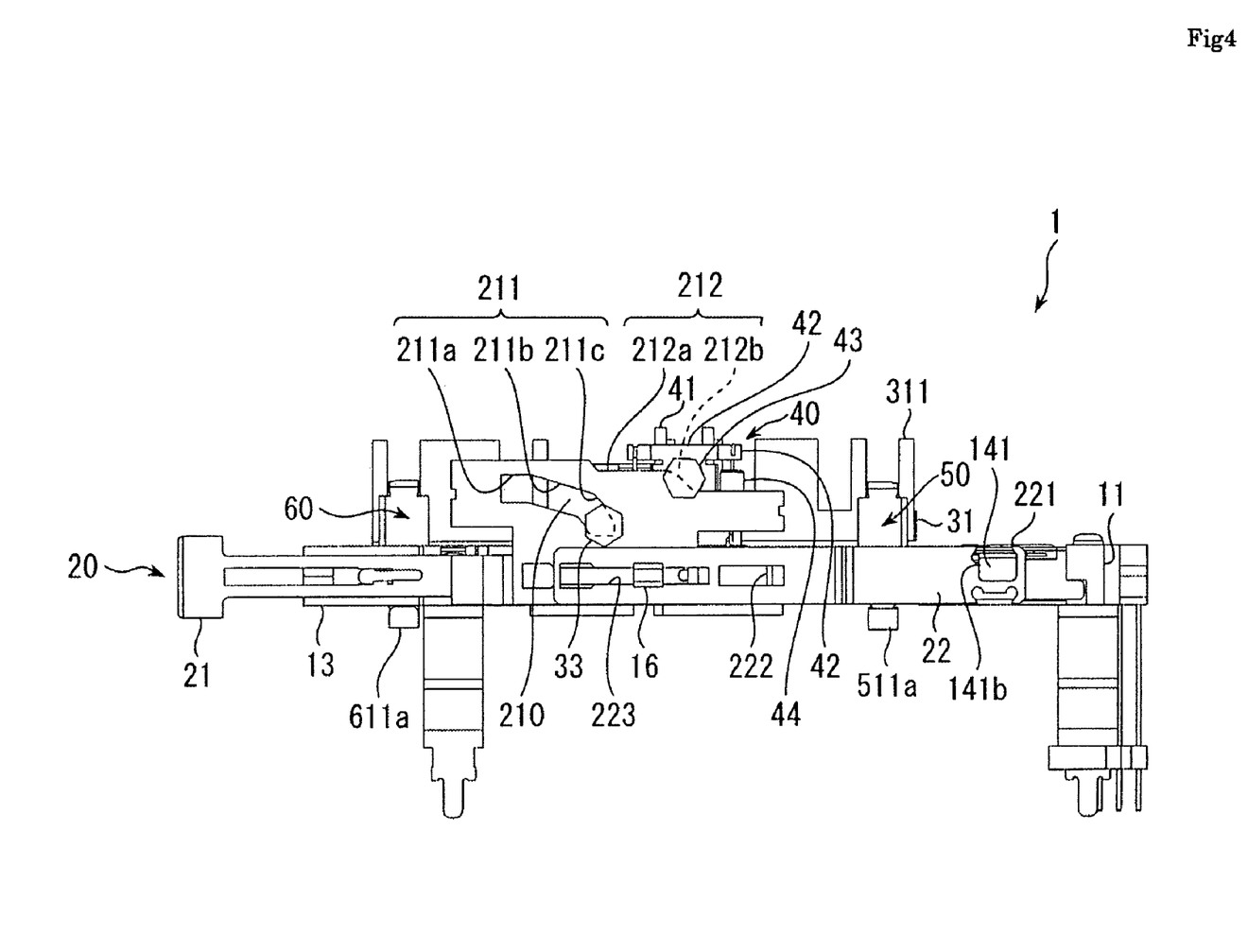
FIG. 4 is a front elevation (viewed in the direction of Arrow A in FIG. 3) of a card slot relating to a first embodiment of the present invention

The second cam surface 212 is provided with a flat section 212a, and a steep slope section 212b (corresponding to the second steep slope section) (refer to FIG. 4). The second cam surface 212 supports the second guide pin 43 (described later) that is provided on the biasing mechanism 40 on its upper surface, and guides the second guide pin in line with its own shape. As will be described later, the steep slope section 212b of the second cam surface 212 is configured to be urged forwards in the moving direction (to the left in FIG. 4) at the time of IC card insertion by the biasing mechanism 40 in accordance with movement of the card ejection lever 20.

The outer member 22 comprises an indent section 221, a projecting section 222 (refer to FIG. 3) and a slit 223. As mentioned previously, the hook 141b of the link member 141 is fitted into the indent section 221. The projecting section 222 projects towards the inner member 21, and comes into contact with the tip end of the inner member 21 (the right end in FIG. 1). As previously described, the slider 16 is inserted into the slit 223.

The heat sink 30 comprises a heat sink body 31, a first spring 32, a first guide pin 33 and a setscrew 35. The heatsink body 31 is constructed of a material having good thermal radiation performance, such as aluminum alloy etc. The lower surface of the heat sink body 31 is made a flat surface. A plurality of heat radiating fins 311 are formed on the upper surface of the heat sink body 31. The upper surface shape of the heat sink body 31 is substantially square in this embodiment (refer to FIG. 1 to FIG. 3).

The first spring 32 is a plate spring. A hole 321 is formed in the vicinity of the center of the first spring 32, passing through in a thickness direction. Also, the first guide pin 33 is attached to one end 32a of the first spring 32. In this way, the one end 32a of the first spring 32 is lowered with insertion of the IC card 3 into the slot body 10 (described later). The other end 32b of the first spring 32 is attached to a side surface of the guide section 12 of the slot body 10, so as to be capable of rotating (refer to FIG. 5). In this way the other end 32b of the first spring 32 is attached to the slot body 10.

The setscrew 35 is screwed into the heat sink body 31 in a state inserted into the hole 321 formed in the first spring 32. In this way the first spring 32 is made capable of swinging in a small range with the setscrew 35 as a center. Also, in this manner the first spring 32 is attached to substantially the center of the heat sink body 31, to support the heat sink body 31 in a sort of suspended in midair state.

The first guide pin 33 is attached to the heat sink body 31 via one end 32a of the first spring 32. Also, the first guide pin 33 is inserted into the inside of the through hole 210 forming the first cam surface 211 so as not to drop out, so as to be capable of moving in accordance with the shape of the first cam surface 211.

As will be described later, if the first cam surface 211 moves in accordance with insertion of the IC card 3, the first guide pin 33 presses the first spring 32 down in line with the shape of the first cam surface 211, and as a result of that the heat sink body 31 is lowered by means of the first spring 32. Specifically, the guide pin 33 is lowered with insertion of the IC card 3 inside the slot, and presses the heat sink body 31 downwards.

In more detail, the first guide pin 33 moves along the gentle slope section 211b of the first cam surface 221 with insertion of the IC card 3, and then moves along the first steep slope section 211c (refer to FIG. 4). Then, when the first guide pin 33 has reached a mid point of the first steep slope section 211c or a rear end position, the lower surface of the heat sink body 31 is brought into contact with the upper surface of the IC card 3.

Figure 2:
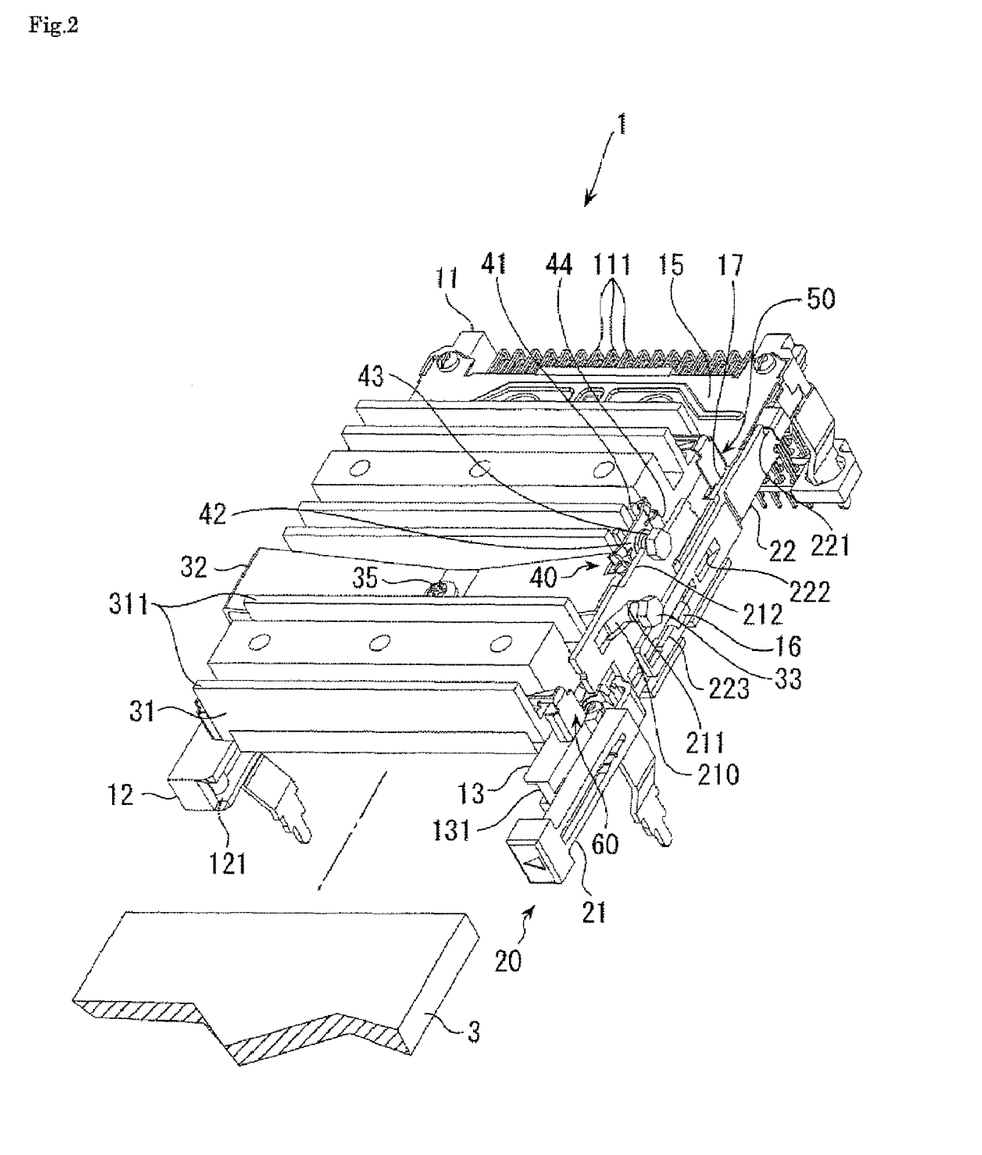
FIG. 2 is a perspective view of a card slot relating to one embodiment of the present invention.
Figure 3:
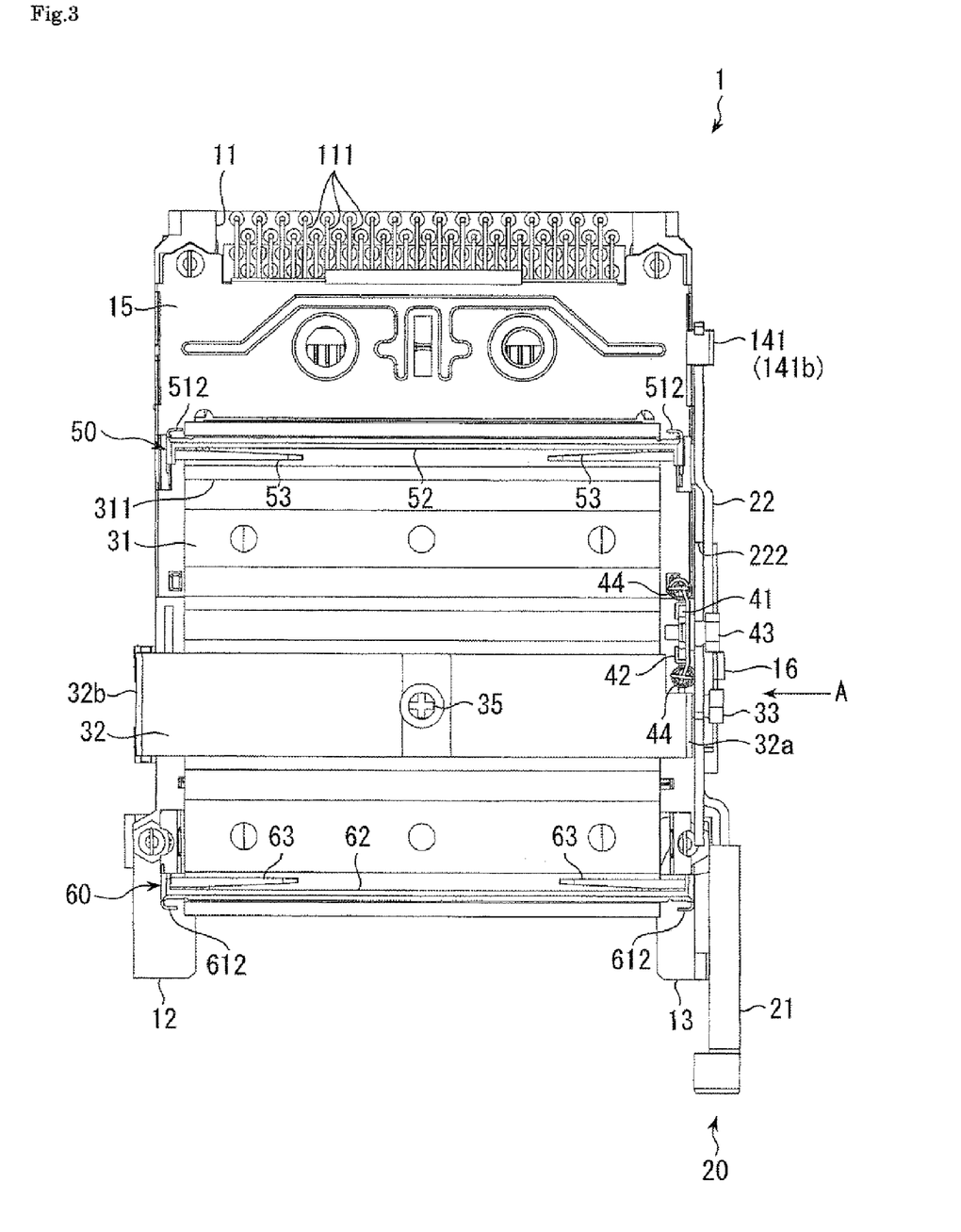
FIG. 3 is a plan view of a card slot relating to one embodiment of the present invention.

The biasing mechanism 40 comprises a guide post 41, a slider 42, a second guide pin 43 and two second springs 44 (refer to FIG. 1 to FIG. 3).

The guide post 41 is supported by the upper surface of the guide section 13 of the slot body 10. The guide post 41 also extends in the vertical direction in FIG. 1

The slider 42 is fitted with play so as not to drop off from the guide post 41. The slider 42 is also capable of moving up and down in the extension direction of the guide post 41.

The second guide pin 43 is attached to the slider 42 so as not to drop off. The second guide pin 43 is further attached to the slider 42 so as to be capable of rotation about its axis.

The second guide pin 43 is mounted on the upper surface of the second cam surface 212, and is supported by this second cam surface 212 (refer to FIG. 4). The second guide pin 43 first moves along the flat section 212a of the second cam surface 212 as a result of insertion of the IC card 3, and then moves along the upper surface of the second steep slope section 212b.

In this embodiment, the two second springs 44 are constructed using coil springs for imparting tension. The second springs 44 are suspended between the lower surface of the guide post 41 and the upper surface of the slider 42, and operate so as to pull the slider 42 downwards. In this way, the second springs 44 bias the second guide pin 43 in a direction to press against the second cam surface 212. With this configuration, the second guide pin 43 biases the second steep slope section 212b forwards in the movement direction of the second cam surface 212 when the second guide pin 43 moves on the upper surface of the second steep slope section 212b moves. That is, under the biasing force of the second springs 44 the second cam surface 212 is urged forward in the direction of its movement.

The first support 50 comprises two first leg sections 51, a first link section 52 and two first pressing springs 53 (refer to FIG. 1 and FIG. 6 to FIG. 10).

The two first leg sections 51 are arranged facing positions sandwiching the heat sink body 31, close to one end side of the slot body 10 (the right side in FIG. 2). The respective first leg sections 51 each have a transverse section, at a center part thereof, that is substantially L-shaped (refer to FIG. 1 and FIG. 9). In detail, the first leg sections 51 are respectively provided with a leg section body 511 and an extension section 512 (refer to FIG. 9).

Figure 5:
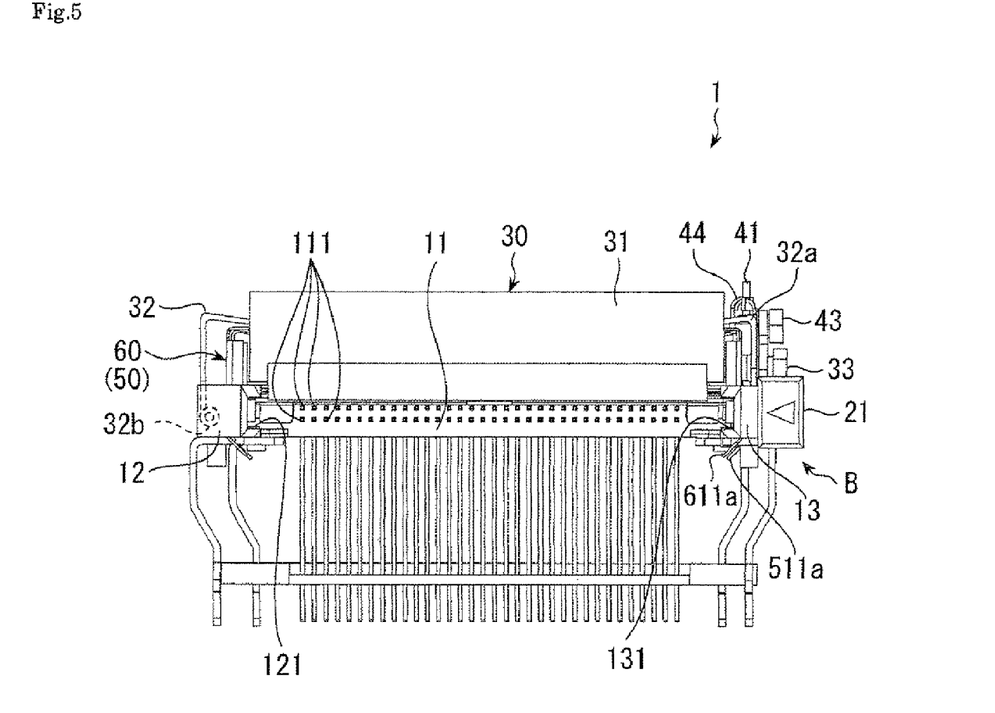
FIG. 5 is a left side view of the card slot of FIG. 4.
Figure 6:
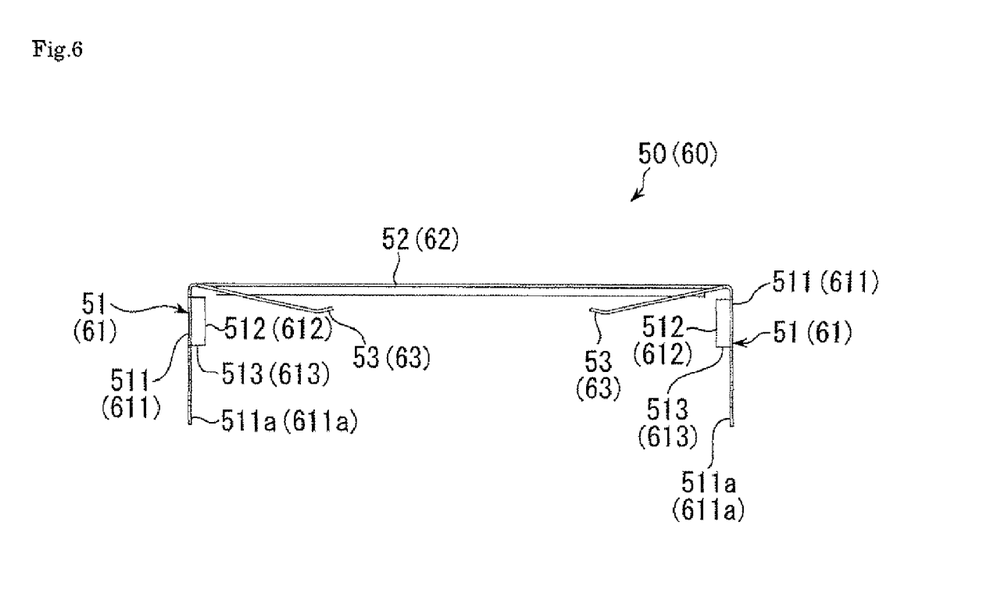
FIG. 6 is a front elevation of a first support and a second support.
Figure 7:
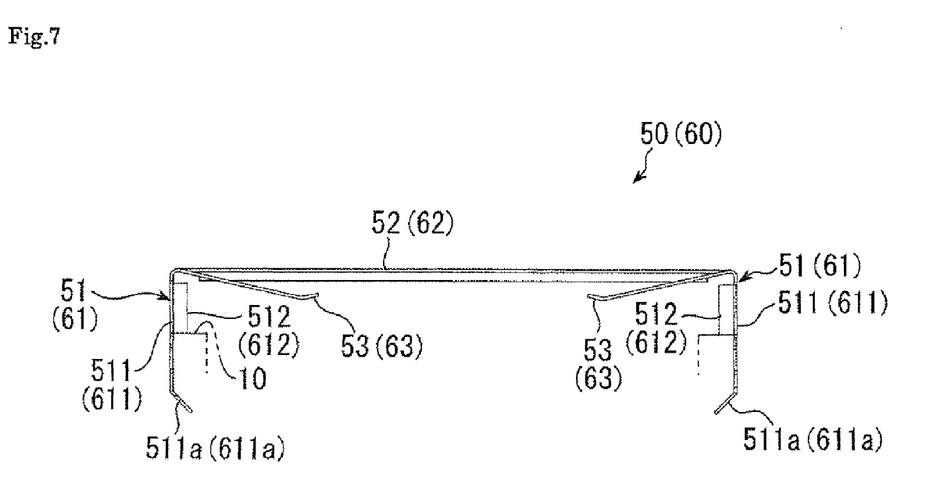
FIG. 7 is front elevation of a state lower end sections of the first support and the second support are bent.
Figure 8:
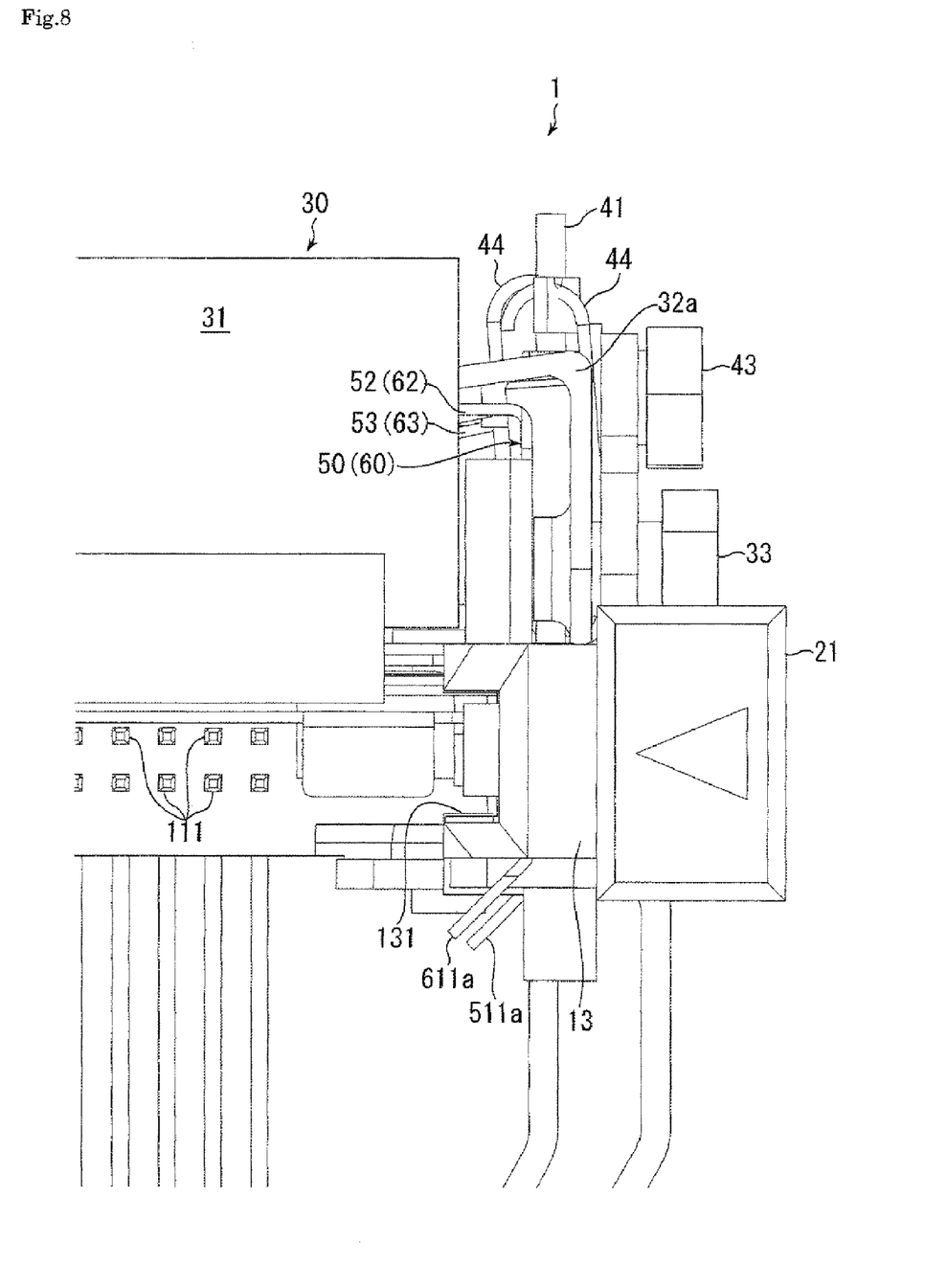
FIG. 8 is an enlarged view of the B section in FIG. 5.
Figure 9:
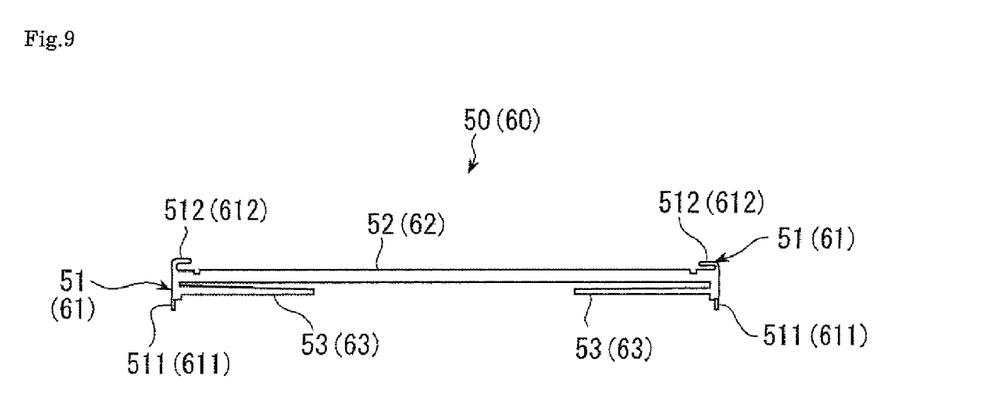
FIG. 9 is a plan view of the first support and the second support.
Figure 10:
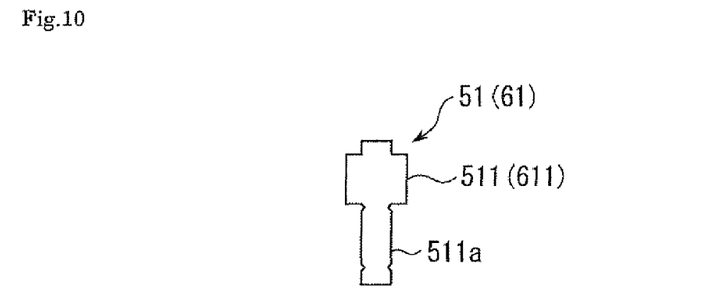
FIG. 10 is a side view of the first support and the second support.

The leg section bodies 511 are formed in a thin-walled plate shape (refer to FIG. 1 and FIG. 6). A lower end portion of the leg section body 511 is fitted into the slot body 10. In more detail, as shown in FIG. 5 and FIG. 8, the lower end section 511a of the leg section body 511 is inserted into the slit 17 formed in the slot body 10 (refer to FIG. 1), and is further bent towards the inner side (the direction of the heat sink body 31) for retention. The first support 50 in a state with the lower end section 511a bent over is shown in FIG. 7.

The extension sections 512 extend in a direction orthogonal to the surfaces of the leg section bodies 511. In more detail, the extension sections 512 extend from a middle position in the length direction of the leg section bodies 511 (positions slightly above the lower end sections 511a) in a direction going towards the heat sink body 31.

The lower surfaces of the extension sections 512 constitute contact surfaces 513 for contacting the upper surface of the slot body 10. In this way, contact surfaces that extend in the direction of the heat sink body 31 and contact the upper surface of the slot body 10 are formed close to the low end of the first support 50. The position of the upper surface of the slot body 10 is shown by a two-dot line in FIG. 7.

The first linking section 52 links fellow upper end vicinities of the first leg sections 51. Specifically, the first linking section 52 is made a long and narrow plate. In more detail, the first linking section 52 has a so-called angled shape with an L-shaped cross section. Further, the linking section 52 is constructed by integrating two first leg sections 51.

The two first pressing springs 53 extend from respective upper ends of the two first leg sections 51 towards an upper surface of the heat sink body 31, to press the upper surface of the heat sink body 31 downwards. Specifically, the two pressing springs 53 extend from close to joining sections of the first leg sections 51 and the first linking section 52. The first pressing springs 53 can also extend from the first linking section 52.

The second support 60 is constructed almost the same as the first support 50 in this embodiment. Specifically, the second support 60 comprises two second leg sections 61, a second link section 62 and two second pressing springs 63 (refer to FIG. 1 and FIG. 6 to FIG. 10). Incidentally, in FIG. 6 to FIG. 10, reference numerals for the second support 60 are shown in brackets.

The two second leg sections 61 are arranged facing positions sandwiching the heat sink body 31, close to another end side of the slot body 10 (the left side in FIG. 2). The respective second leg sections 61, similarly to the first leg sections 51, each have a transverse section that is substantially L-shaped (refer to FIG. 1 and FIG. 9). Specifically, the second leg sections 61 are respectively provided with a leg section body 611 and an extension section 612.

The leg section body 611 is formed in a thin-walled plate shape, and the lower end section 611a of the leg section body 611 is inserted into a slit 18 formed in the slot body 10 (refer to FIG. 1). The lower end section 611a is further bent inwards (in the direction of the heat sink body 31).

The extension sections 612 extend in a direction orthogonal to the surfaces of the leg section bodies 611. The lower surfaces of the extension sections 612 constitute contact surfaces 613 for contacting the upper surface of the slot body 10. In this way, contact surfaces that extend in the direction of the heat sink body 31 and contact the upper surface of the slot body 10 are formed close to the lower end of the second support 60. The rest of the structure of the second leg sections 61 is substantially the same as that of the first leg sections 51, and so further detailed description is omitted.

The second linking section 62 links fellow upper end vicinities of the second leg sections 61. The second linking section 62 is constructed the same as the first linking section 52.

The second pressing springs 63 extend from respective second leg sections 61 towards an upper surface of the heat sink body 31, to press the upper surface of the heat sink body 31 downwards. Similarly to the first pressing springs 53, the second pressing springs can also extend from the second linking section 62.

Using the above described structure, with this embodiment the first pressing springs 53 and the second pressing springs 63 cause contact close to the four corners of the upper surface of the heatsink body 31 (refer to FIG. 3).

Figure 11:
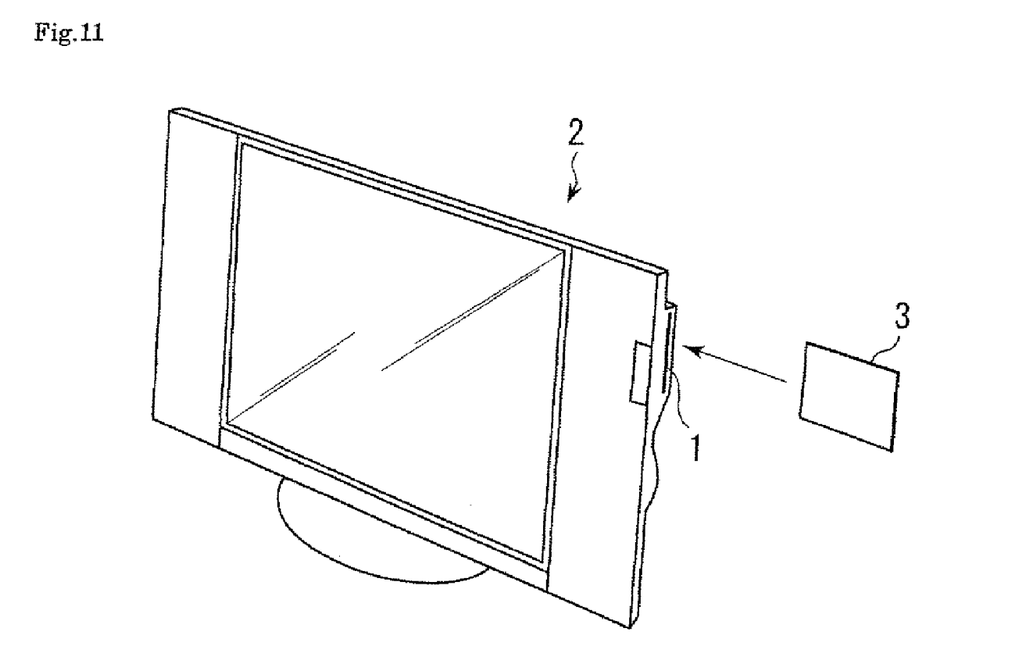
FIG. 11 is an explanatory view showing a state where the card slot of one embodiment of the present invention is fitted to a flat-screen television.

The card slot 1 constructed as described above, similarly to the card slot of the related art, is used incorporated into an electronic device 2 (refer to FIG. 11). With the example in the drawings, a flat-screen television is used as the electronic device 2.

(Operation of the Device of the Embodiment)

Next, operation of the card slot relating to this embodiment constructed as described above will be described with reference mainly to FIG. 12.

(Initial State)

Figure 12:
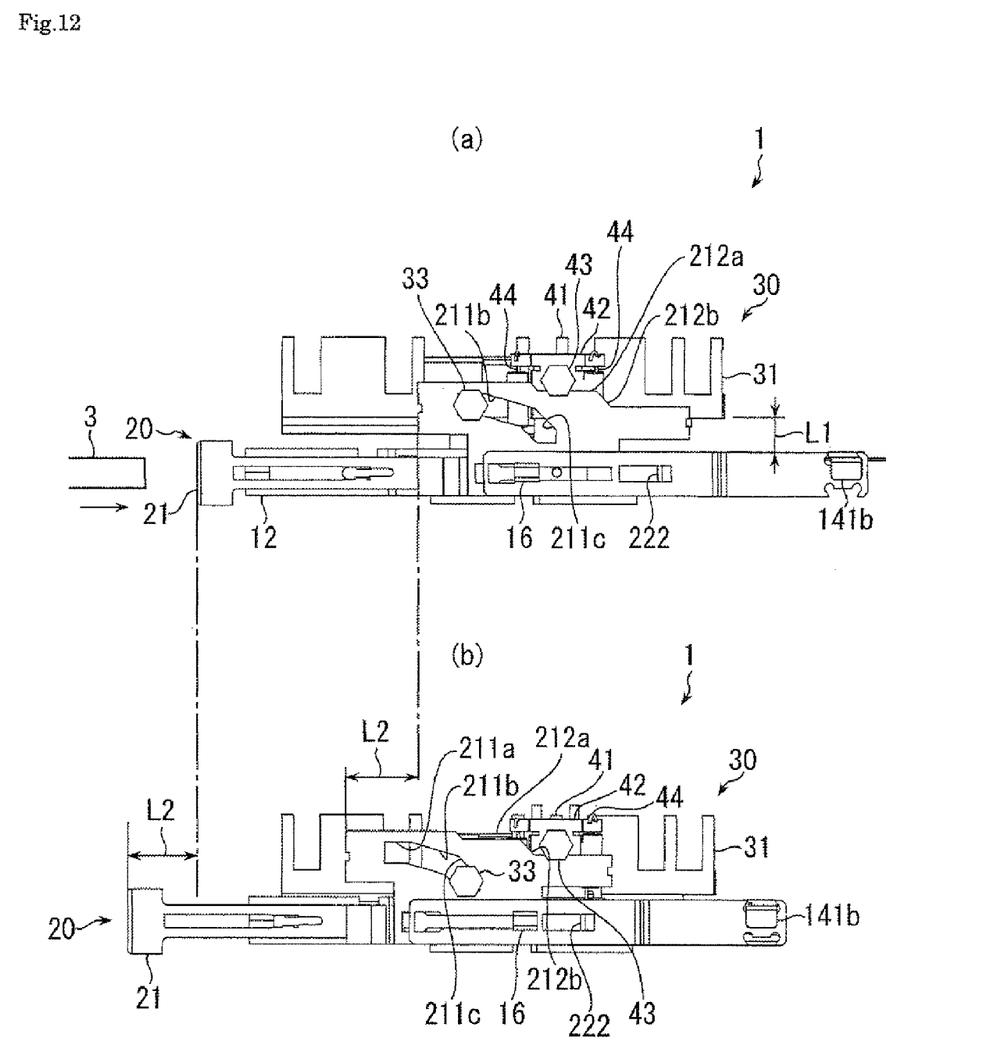
FIG. 12 is explanatory drawings for describing operation of the card slot, with FIG. 12(*a*) showing an initial state and FIG. 12 (*b*) showing a state where an IC card has been inserted.

In an initial state, as shown in FIG. 12(*a*), the heatsink body 31 of the heat sink 30 is raised up. The arrangement state of each of the members in this initial state is as described in the following.

card ejection lever 20: pushed in (moved to the right side in FIG. 12)

first guide pin 33: positioned at the flat section 211 or the gentle slope section 211b of the first cam surface 211 (either is possible depending on the design)

second guide pin 43: positioned at the flat section 212a of the second cam surface 212.

In this state, the heat sink body 31 is raised up by the dimension L1 shown in FIG. 12(*a*), and so there is no interference between the IC card 3 and the heat sink body 31, and it is possible to insert the IC card 3 into the card slot 1 with only a slight insertion force.

(Operation at the Time of Pushing in)

Next, the IC card 3 (refer to FIG. 2) is inserted from the left side of FIG. 12 into the card slot 1. After that, the tip end of the inserted IC card 3 contacts the other end side of the link member 141 of the card ejection mechanism 14 (refer to FIG. 1). If the IC card 3 is inserted further, the other end of the link member 141 is pressed in further, and moves in the direction of insertion. The hook 141b formed on one end side of the link member 141 is then moved by a link operation in a direction opposite to the insertion direction. The outer member 22 of the card ejection lever 20 is then moved in a direction opposite to the insertion direction due to attachment to the hook 141b. At this time, the projecting section 222 of the outer member 22 pushes the end section of the inner member 21, and so the inner section 21 also moves in the direction opposite to the insertion direction (refer to FIG. 12(b)).

Since the first cam surface 211 and the second cam surface 212 are formed on the inner member 21, if the inner member 21 moves then these cam surfaces can also move together in the same direction as the inner member 21. In this example, these cam surfaces move in the left direction in FIG. 12.

(Operation of Each Cam Surface)

The first cam surface 211 pushes the first guide pin 33 downwards as it moves. As a result, it is possible to lower the heat sink body 31 by means of the first spring 32. However, while passing through the gentle slope section 211b of the first cam surface 211, the heat sink body 31 is lowered slowly. While this is happening, the heat sink body 31 and the IC card 3 are set not in contact with each other. It is therefore possible to insert the IC card 3 into the card slot 1 with small insertion resistance.

At this time, the second guide pin 43 passes the flat section 212a of the second cam surface 212. The second guide pin 43 passes the flat section 212a while rolling, which means that there is hardly any frictional resistance between the two. It is therefore possible to keep the insertion resistance of the IC card 3 small even if the second guide pin 43 is provided.

Next, the IC card 3 is pushed in further. Then, as a result of this pressing force, each cam surface is moved further in a direction opposite to the insertion direction of the card 3 by means of the card ejection mechanism 14. Roughly speaking, if the tip end of the IC card 3 reaches the vicinity of a position meshing with the pins 111 of the housing 11, the first guide pin 33 reaches the steep slope section 211c of the first cam surface 211. At almost the same time, the second guide pin 43 also reaches the steep slope section 212b of the second cam surface 212.

The steep slope surface 211c of the first cam surface 211 pushes the first guide pin 33 rapidly downwards as it moves. As a result, midway along the steep slope section 211c, the lower surface of the heat sink body 31 contacts the upper surface of the IC card 3. At this time, frictional resistance is generated between the lower surface of the heat sink body 31 and the upper surface of the IC card 3. However, since the heatsink body 31 is elastically (specifically flexibly) pressed against the upper surface of the IC card 3 by means of the first spring 32, at the time of initial contact between the heat sink body 31 and the IC card 3 it is possible to keep the frictional resistance between the two small.

If the first guide pin 33 is lowered further along the steep slope section 211c, the first spring 32 is pressed down further. As a result, the lower surface of the heat sink body 31 is more strongly pressed against the upper surface of the IC card 3 by the first spring 32. Accordingly, the first cam surface 211 is subjected to bounce from the first spring 32. This also leads to increase in the insertion resistance of the IC card 3.

Here, in this embodiment, the first guide pin 33 is lowered at a steep angle along the steep slope section 211c. As a result, the force required to lower the first guide pin 33 is large. This force functions as a resistance force against the inner member 21 moving in the opposite direction to the IC card 3. As a result, therefore, this force acts in a direction to further increase insertion resistance of the IC card 3.

However, with this embodiment, the second guide pin 43 presses this steep slope section 212b downwards at the steep slope section 212b of the second cam surface 212, because of the urging force of the second spring 44. Therefore, using a force component generated at the steep slope section 212b, the steep slope section 212b is pushed in a direction opposite to the insertion direction of the IC card 3. As a result, the inner member 21 where the second cam surface 212 is formed is also subjected to the urging force in the same direction.

As a result, at the inner member 21 it is possible to lower the moving resistance introduced by the first guide pin 33 passing the steep slope section 211c using the urging force of the second spring 44. In this way, according to this embodiment there is the advantage that it is possible to suppress increase in insertion resistance of the IC card 3.

For example, if insertion force required for insertion of the IC card 3 is increased rapidly midway along the insertion stroke, there is a possibility that the user may stop inserting the card even if connection between the IC card 3 and the card slot 1 is in an incomplete state.

On the other hand, according to the card slot 1 of this embodiment, at almost the same moment as the insertion resistance of the IC card 3 is increased, it is possible to reduce this insertion resistance using the urging force of the second spring 44. As a result the insertion resistance of the IC card 3 is made level, and together with making the connection operation of the IC card 3 easy, there is the advantage that connection is made more reliable.

The movement stroke of the card ejection lever 20 with insertion of the IC card 3 is shown by the reference numeral L2 in FIG. 12

With this embodiment, since it is possible to move the second cam surface 212 utilizing the insertion of the IC card 3, it is possible to reduce the force required to push the IC card 3 in with a comparatively simple structure.

Furthermore, with this embodiment, since the first guide pin 33 is being lowered rapidly along the steep slope section 211c, it is possible to set the point in time when frictional force between the heatsink body 31 and the IC card 3 increases close to the end of the stroke required for insertion of the IC card 3 (that is, at a point in time when the pins 111 of the housing 11 are almost completely inserted in the IC card 3, and electrical connection between the two is substantially complete). As a result, even if insertion force of the IC card 3 becomes large during the insertion of the IC card 3 because of the frictional resistance between the heatsink body 31 and the IC card 3, at that point in time it is possible to have already completed a reliable electrical connection. With this embodiment, because of this advantage, it becomes possible to reliably complete connection between the IC card 3 and the electronic device 2.

Also, according to this embodiment, in a state where the IC card 3 has been fully inserted into the card slot 1, it is possible to bring the heat sink 30 into contact with the upper surface of the IC card 3. In this way, it is possible to efficiently radiate generated heat from the IC card 30 to the outside.

(Operation when Ejecting IC Card)

Next, operation when ejecting the IC card 3 will be described. At this time, similarly to the related art, the card ejection lever 20 is pushed in. The card ejection mechanism 14 then rotates in a direction opposite to that previously described, and force in the pressing in direction is applied to the tip end of the IC card 3.

If the card ejection lever 20 is pushed in, the first guide pin 33 moves on the first cam surface 211 (in this case, using the lower surface of the first cam surface 211) in a direction opposite to that described previously. In this way, the heat sink body 31 is raised up, and it is possible to eliminate frictional resistance between the heat sink body 31 and the IC card 3. At this time, opposite to the situation previously described, the second guide pin 43 is raised up along the steep slope section 212b of the second cam surface 212, and moves on the flat section 212a.

Here, at the time of movement of the second guide pin 43, there is resistance due to the tension of the second springs 44. However, when ejecting the IC card, the user pushes the card ejection lever 20 in until the IC card comes out. There is therefore hardly any danger of erroneous operation even if the pushing in force of the ejection lever 20 is increased slightly.

(Operation of First Support and Second Support)

Next, operation of the first support 50 and the second support 60 will be described. In FIG. 12, illustration of these supports has been omitted.

As shown in FIG. 12(a), in an initial state where the heatsink body 31 is raised up, the upper surface of the heatsink body 31 approaches the linking section 52 of the first support 50 and the linking section 62 of the second support 60. In this state, the amount of deformation of the pressing springs 53 and 63 that are contacting the upper surface of the heatsink body 31 becomes large. Specifically, in this initial state the heatsink body 31 is pressed downward by a comparatively strong force due to the pressing springs 53 and 63.

On the other hand, the heatsink body 31 is supported so as to not drop down by the first spring 32. Specifically, the center part of the heatsink body 31 is pulled upwards by the first spring 32, and close to the two ends of the heatsink body 31 are pressed downwards by the pressing springs 53 and 63.

Due to the pulling force and the pushing force acting simultaneously on the heatsink body 31, the heatsink body 31 is stabilized at a position where these forces cancel each other out. In this state, at the time of conveyance of the substrate, for example, it is possible to reduce the possibility of variation in the position of the heatsink body 31, even if there is strong impact applied to the card slot as a result of dropping the substrate etc. Specifically, it is possible to improve the impact resistance with the card slot of this embodiment.

Also, with the card slot of this embodiment, since the vicinities of the four corners of the heatsink body 31 are pressed by the pressing springs 53 and 63, there is the advantage that it is easy to retains the heatsink body 31 in a state parallel to the upper surface of the inserted IC card 3. Therefore, according to this embodiment, it is possible to bring the heatsink body 31 and the upper surface of the IC card 3 in contact with each other in a state where they are parallel, and as a result there is the advantage that it is possible to reliably and efficiently radiate heat from the IC card 3.

Also, with the card slot of this embodiment, since the first linking section 52 and the second linking section 62 are provided on the first support 50 and the second support 60, it is possible to keep the amount of deformation of the first leg section 51 and the second leg section 61 small. Specifically, if impact force is applied to the card slot 1, the force from the heatsink body 31, which is comparatively heavy, is applied via the first pressing spring 53 and the second pressing spring 63 to the first leg section 51 and the second leg section 61. However, with this embodiment the force from the heatsink body 31 can be dispersed by the first linking section 52 and the second lining section 62 and absorbed. As a result, it is possible to make the force applied to a single leg section small, and in this way it is possible to keep the amount of deformation of the leg sections small.

Further, with the card slot of this embodiment, since the contact surface 513 and the contact surface 613 are provided on the first support 50 and the second support 60, it is possible to further keep the amount of deformation of the first leg section 51 and the second leg section 62 small. Specifically, if impact force is applied to the card slot 1, or applied from the heatsink body 31 to the first leg section 51 and the second leg section 61, force likely to cause buckling in a direction of the heatsink body 31 may sometimes be applied to either the first leg section 51 or the second leg section 61. At this time, it is possible to support the first leg section 51 and the second leg section 61 using the contact surface 513 and the contact surface 613. It is therefore possible to keep the amount of deformation of the leg sections small.

Also, with this embodiment, as described above, since the contact surface 513 and the contact surface 613 are provided, it is possible to make the first leg section 51 and the second leg section 61 thin-walled sections. If these leg sections were made thick-walled, the card slot 1 would be increased in size, causing problems with the mounting of the substrate. With this embodiment, since it is possible to make the first leg section 51 and the second leg section 61 thin-walled, there is the advantage that it is possible to make the card slot 1 small in size.

Further, with this embodiment, the lower end section 511a of the first leg section 51 and the lower end section 611a of the second leg section 61 are inserted into the slot body 10, and by bending these lower end sections the first leg section 51 and the second leg section 61 are fitted to the slot body 10. There is therefore no need to use adhesive to fix the first leg section 51 and the second leg section 61, and it is possible to simplify the manufacturing process.

The card slot of the present invention, and an electronic device provided with such a card slot, are not limited to the above-described embodiments. The present invention can be applied to various modifications without departing from the scope of the invention.

While illustrative embodiments have been illustrated and described, it will be appreciated that various changes can be made therein without departing from the spirit and scope of the invention.

The embodiments of the invention in which an exclusive property or privilege is claimed are defined as follows:

1. A card slot comprising a slot body, a heat sink, a first support and a second support, the slot body being configured to internally store an IC card, the heat sink being provided with a heat sink body and a first spring, the first spring being attached to the substantial center of an upper surface of the heat sink body, and supporting the heat sink body, and the first spring being lowered with insertion of the IC card inside the slot, and pressing the heat sink body downwards, wherein the first support comprises two first leg sections, a first linking section and a first pressing spring, the two first leg sections are arranged facing positions sandwiching the heat sink body close to one end side of the slot body, the first linking section links fellow upper end vicinities of the two first leg sections, the first pressing spring extends from either the first leg sections or the first linking section towards an upper surface of the heat sink body, to press the upper surface of the heat sink body downwards, the second support comprises two second leg sections, a second linking section and a second pressing spring, the two second leg sections are arranged facing positions sandwiching the heat sink body close to another end side of the slot body, the second linking section links fellow upper end vicinities of the two second leg sections, and the second pressing spring extends from either the second leg sections or the second linking section towards an upper surface of the heat sink body, to press the upper surface of the heat sink body downwards.

2. The card slot of claim 1, wherein the upper surface shape of the heat sink body is substantially square, there are two each of the first pressing spring and the second pressing spring, and the first pressing springs and the second pressing springs make contact close to the four corners of the upper surface of the heat sink body.

3. The card slot of claim 1, wherein the first spring is constituted as a plate spring, one end of the first spring being lowered with insertion of the IC card into the slot body, and the other end of the first spring being attached to the slot body.

4. The card slot of claim 3, further comprising a card ejection lever, the card ejection lever being provided with a cam surface, the cam surface being moved by insertion force of the IC card as the IC card is inserted into the slot body, the heat sink being further provided with a first guide pin, the first guide pin being attached to the other end of the first spring, and, the first guide pin is lowered further by movement of the cam surface.

5. The card slot of claim 1, wherein contact surfaces that extend in the direction of the heat sink body and contact the upper surface of the slot body are formed on the first leg section of the first support or the second leg section of the second support.

6. The card slot of claim 5, wherein the first leg section and the second leg section are respectively comprises a leg section body and an extension section, the leg section body is formed in a plate shape, a lower end section of the leg section body is fitted into in the slot body, the extension section is extended from a position above the lower end section in a direction orthogonal to the surface of the leg section body, and a lower surface of the extension section is made the contact surface.

7. An electronic device comprising the card slot of claim 1.

* * * * *

UNITED STATES PATENT AND TRADEMARK OFFICE
CERTIFICATE OF CORRECTION

PATENT NO. : 7,545,638 B2
APPLICATION NO. : 11/955756
DATED : June 9, 2009
INVENTOR(S) : H. Aoto et al.

It is certified that error appears in the above-identified patent and that said Letters Patent is hereby corrected as shown below:

| COLUMN | LINE | ERROR |
|---|---|---|
| Title Page, Item (57) | Abstract | "are arranged facing positions" should read --are arranged in facing positions-- |
| Title Page, Item (57) | Abstract | "are arranged facing positions" should read --are arranged in facing positions-- |
| 14 (Claim 6, | 14 line 2) | "are respectively comprises" should read --respectively comprises-- |
| 14 (Claim 6, | 17-18 lines 5-6) | "fitted into in the" should read --fitted into the-- |

Signed and Sealed this

First Day of December, 2009

David J. Kappos
*Director of the United States Patent and Trademark Office*